United States Patent
Pipe

(10) Patent No.: US 9,933,505 B2
(45) Date of Patent: Apr. 3, 2018

(54) SYSTEM AND METHOD FOR MOTION CORRECTION IN MAGNETIC RESONANCE IMAGING

(71) Applicant: James Grant Pipe, Glendale, AZ (US)

(72) Inventor: James Grant Pipe, Glendale, AZ (US)

(73) Assignee: Dignity Health, San Francsico, CA (US)

( * ) Notice: Subject to any disclaimer, the term of this patent is extended or adjusted under 35 U.S.C. 154(b) by 207 days.

(21) Appl. No.: 14/781,659

(22) PCT Filed: Apr. 1, 2014

(86) PCT No.: PCT/US2014/032508
§ 371 (c)(1),
(2) Date: Oct. 1, 2015

(87) PCT Pub. No.: WO2014/165503
PCT Pub. Date: Oct. 9, 2014

(65) Prior Publication Data
US 2016/0061924 A1 Mar. 3, 2016

Related U.S. Application Data

(60) Provisional application No. 61/807,878, filed on Apr. 3, 2013.

(51) Int. Cl.
*G01R 33/565* (2006.01)
*G06T 11/00* (2006.01)
(Continued)

(52) U.S. Cl.
CPC ... *G01R 33/56509* (2013.01); *G01R 33/4818* (2013.01); *G06T 7/0012* (2013.01);
(Continued)

(58) Field of Classification Search
None
See application file for complete search history.

(56) References Cited

U.S. PATENT DOCUMENTS

2005/0073303 A1* 4/2005 Harer ................ G01R 33/4824
324/307
2006/0028206 A1* 2/2006 Zhang ................ G01R 33/561
324/309

(Continued)

FOREIGN PATENT DOCUMENTS

WO 2008/132659 A2 11/2008
WO 2012/145754 A1 10/2012

OTHER PUBLICATIONS

Pipe, "Motion Correction With PROPELLER MRI: Application to Head Motion and Free-Breathing Cardiac Imaging", Magnetic Resonance in Medicine, 42:963-969; 1999.*

(Continued)

*Primary Examiner* — Matthew Bella
*Assistant Examiner* — Brian Shin
(74) *Attorney, Agent, or Firm* — Quarles & Brady LLP

(57) ABSTRACT

Described here are systems and methods for estimating bulk rotation and translation of an imaged subject between different blades in a PROPELLER MRI or similar sequence. Correlations between unique pairs of blades are calculated and the relative shift values that maximize the correlation between each pair of blades are identified as relative shift values to be applied for motion correction. Using this method, no reference blade is required, nor does a computationally expensive iterative process need to be performed.

20 Claims, 4 Drawing Sheets

(51) Int. Cl.
    *G01R 33/48*     (2006.01)
    *G06T 7/00*     (2017.01)
    *G06T 7/11*     (2017.01)

(52) U.S. Cl.
    CPC .............. *G06T 7/11* (2017.01); *G06T 11/006* (2013.01); *G01R 33/4824* (2013.01); *G06T 2207/10088* (2013.01)

(56) References Cited

U.S. PATENT DOCUMENTS

2008/0169808 A1    7/2008   Taniguchi et al.
2010/0117645 A1    5/2010   Eggers et al.

OTHER PUBLICATIONS

International Search Report and Written Opinion dated Aug. 13, 2014 in connection with PCT/US2014/032508.

* cited by examiner

SYSTEM AND METHOD FOR MOTION CORRECTION IN MAGNETIC RESONANCE IMAGING

CROSS-REFERENCE TO RELATED APPLICATIONS

This application represents the national stage entry of PCT International Application No. PCT/US2014/032508 filed on Apr. 1, 2014, which claims the benefit of U.S. Provisional Application Ser. No. 61/807,878 filed on Apr. 3, 2013, the disclosures of which are incorporated by reference here in their entirety for all purposes.

BACKGROUND OF THE INVENTION

The field of the invention is systems and methods for magnetic resonance imaging (MRI"). More particularly, the invention relates to systems and methods for motion correction of magnetic resonance images.

Due to the relatively long scans times in MRI, patient motion often results in image artifacts. When imaging some structures, such as the brain, the patient's motion can be approximated as rigid body motion with three degrees of both rotation and translation applied to the entire image volume in a time-varying manner. The PROPELLER method, described by J. G. Pipe in "Motion correction with PROPELLER MRI: application to head motion and free-breathing cardiac imaging," *Magn Reson Med*, 1999; 42(5): 963-969, has been developed to estimate and remove the effects of in-plane rigid body motion, while mitigating the effects of through-plane motions via the use of data rejection.

The PROPELLER method for motion correction includes both data acquisition and image reconstruction. Data are acquired in concentric rectangular strips, or "blades," that are rotated about the k-space origin. The central region of k-space is sampled with every blade, which allows for the correction of spatial inconsistencies in position, rotation, and phase between blades. Sampling the central region of k-space with each blade also allows for the rejection of data based on a correlation measurement that indicate through-plane motion, and decreases motion artifacts by effectively averaging low spatial frequencies.

PROPELLER has been shown to be quite effective at mitigating patient motion, but it is not error-free. Inaccurate estimates of motion can lead to corruption of otherwise motion-free data sets, as well as result in non-optimal correction of motion-corrupted data sets. The motion estimates determined in the PROPELLER method are obtained separately for rotation and translation, but in both cases the motion is framed as a simple shift estimate. For instance, rotation correction is performed in the theta direction after gridding the k-space data to polar coordinates, and translation correction is performed directly in x-y space.

The PROPELLER algorithm estimates the aforementioned shifts by maximizing data correlation between each blade and a reference blade. Two components of this shift estimation algorithm can be potential sources for the remaining errors in this estimation. First, the PROPELLER algorithm depends on choosing an appropriate "reference" blade, to which other blades are iteratively aligned. Poor choice of the reference blade can result a non-optimal solution. A second potential source of error is that when choosing the shift that gives the maximum correlation between blades, the precision of this fit with regard to system noise is not addressed.

It would therefore be desirable to provide systems and methods for motion correction in MRI that address the aforementioned drawbacks of the PROPELLER method.

SUMMARY OF THE INVENTION

The present invention overcomes the aforementioned drawbacks by providing systems and methods for PROPELLER MRI that do not require the use of a reference blade to perform motion correction. As such, the systems and methods of the present invention improve upon the accuracy and reliability of the previous PROPELLER method.

It is an aspect of the invention to provide a method for producing a motion-corrected image using an MRI system. The method includes acquiring data with the MRI system by sampling k-space as a series of blades that are rotated in k-space with respect to each other. Each of these blades includes at least one linear trajectory, and may include a plurality of linear trajectories that may be parallel. A pair of blades including a first blade and a second blade is selected from the acquired data. A relative shift value that maximizes a correlation value between the first blade and the second blade is then calculated, and this relative shift value to at least one of the selected blades to produce at least one motion-corrected blade. This process is repeated for each unique pair of blades in the acquired data. An image is then reconstructed from the motion-corrected blades.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for performing motion correction and image reconstruction in magnetic resonance imaging ("MRI") using a PROPELLER, or similar, data acquisition with an optimized shift estimation algorithm that does not require use of reference data, such as a reference blade. Relative shifts are estimated between blades for rotation estimation, translation estimation, or both. Here "blades" may refer to the k-space or image space representation of the data from a single blade. This shift estimation algorithm will now be described in detail.

Figure 1:
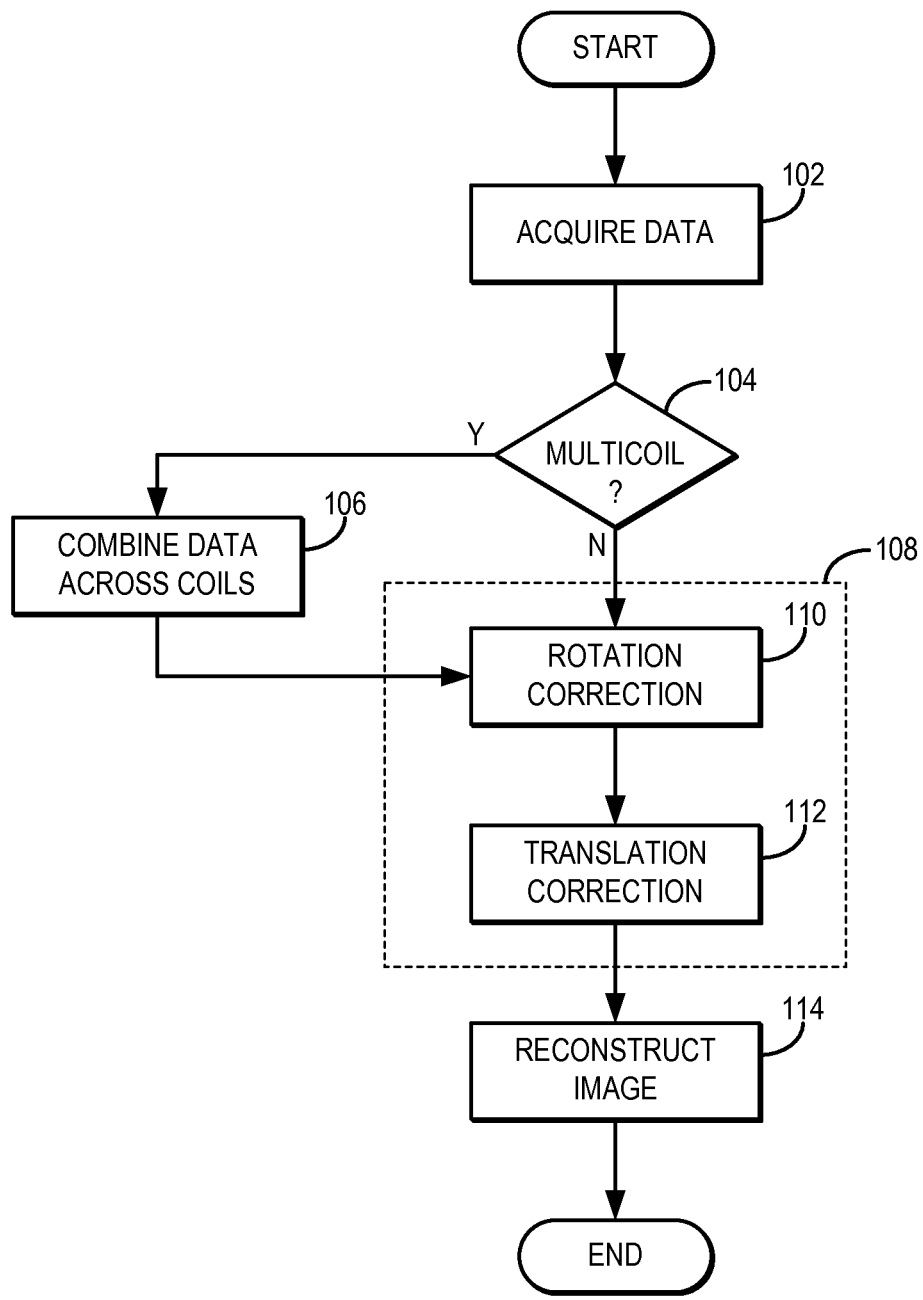
FIG. 1 is a flowchart setting forth the steps of an example of a method for producing a motion-corrected image with an MRI system.
Figure 2A:
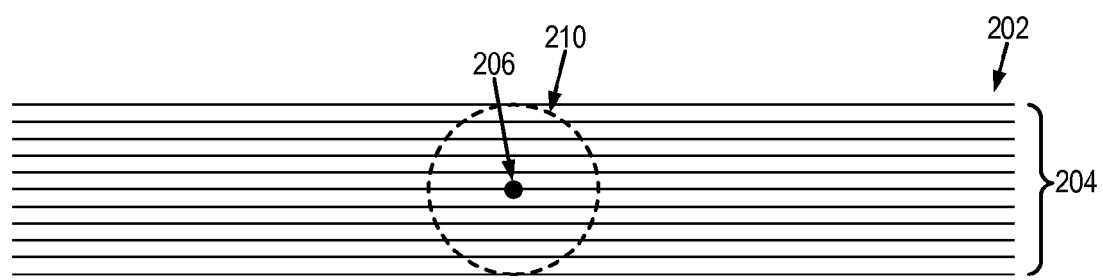
FIG. 2A is an example of a k-space blade that includes a plurality of parallel linear trajectories.

Referring now to FIG. 1, a flowchart setting forth the basic steps of an example of a method for motion correction and image reconstruction in accordance with embodiments of the present invention is illustrated. The method generally begins with the acquisition of data, as indicated at step 102. By way of example, and with reference to FIGS. 2A and 2B, data may be acquired by sampling k-space at N blades 202, each containing L parallel linear trajectories 204. As an example, the linear trajectories 204 in each blade correspond to the L lowest frequency-phase encoded lines in any Cartesian-based data collection method. In general, each blade 202 can be acquired using any number of imaging methods, including pulse sequences that make use of a single excitation radio frequency ("RF") pulse and multiple readouts (e.g., turbo-spin echo or partial echo-planar sequences), or pulse sequences with a series of excitation RF pulses (e.g., fast gradient echo).

Figure 2B:
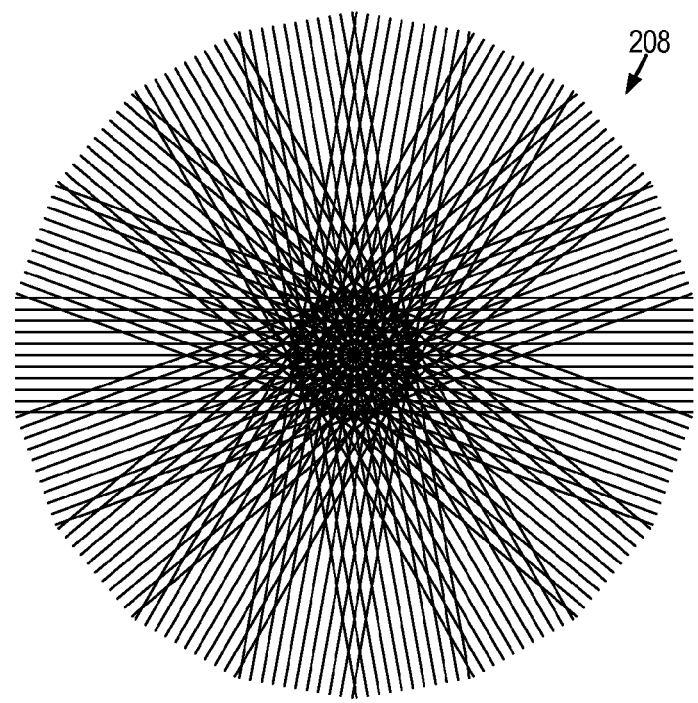
FIG. 2B is an example of a series of k-space blades that are rotated about the k-space origin.

The blades 202 are successively rotated about the center of k-space 206 by an incremental angle, $$d\theta = \frac{\pi}{N}; \qquad (1)$$

so that the total data set 208 spans a circle in k-space, as illustrated in FIG. 2B. If an effective matrix diameter of M is desired, L and N are chosen so that $$LN = M\frac{\pi}{2}. \qquad (2)$$

As a result of the overlap between blades 202, a central circle 210 in k-space with diameter L is resampled for every blade 202. At higher spatial frequencies, the overlap decreases and peripheral k-space values are measured by a single blade 202. The data acquisition just described assumes circular k-space coverage with isotropic resolution and a circular field-of-view ("FOV"). It is possible to decrease the FOV in one direction only, while maintaining isotropic resolution, in order to save time by collecting fewer blades, or fewer lines per blades, than are necessary for a symmetric FOV.

Referring again to FIG. 1, the method proceeds with a determination of whether the data were acquired using a multicoil receiver array, as indicated at step 104. If a multicoil array was used, then the data can be combined across coils before motion correction and image reconstruction, as indicated at step 106.

Motion correction of the acquired data is performed as generally indicated at 108. Motion correction includes performing a rotation correction, as indicated at step 110, and a translation correction, as indicated at step 112. Each of these processes are discussed in more detail below. In general, rotation estimation is performed on data that is regridded to a polar coordinate space by estimating shifts in the θ-direction for each blade, and translation estimation is performed on the rotation-corrected data by estimating shifts in (x, y) space.

As noted above, motion correction generally includes estimating and correcting for the relative shift between blades. This estimation and correction is performed in θ-space for rotation and in (x, y)-space for translation. The motion correction proceeds as follows.

Figure 3A:
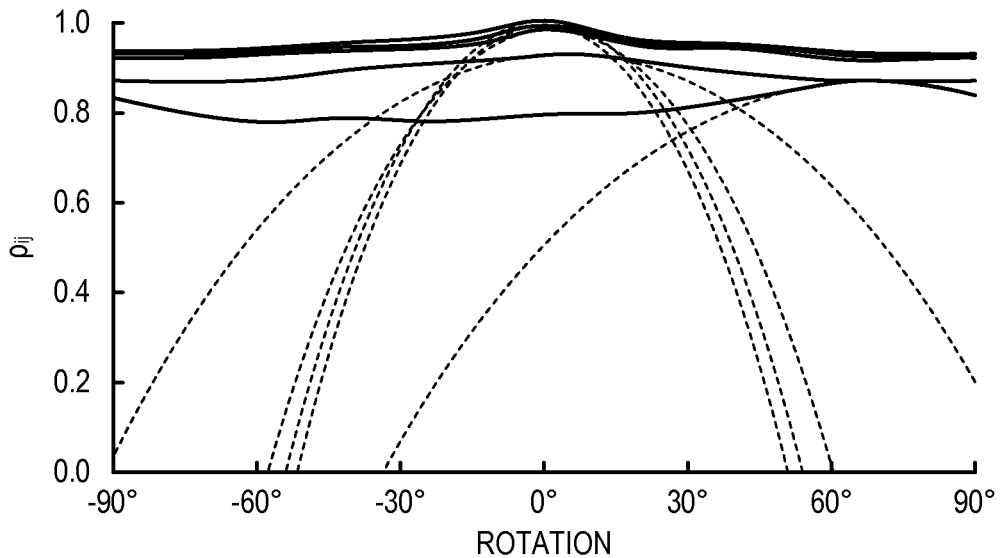
FIG. 3A is an example of correlation values calculated between four pairs of blades and quadratic functions that are fitted to those correlation values.

For two blades, $f_i$ and $f_j$, that are shifted in an arbitrary dimension, x, by shifts $\delta_i$ and $\delta_j$ respectively, the correlation, $\rho_{ij}$, between them can be calculated as a function of their relative displacement in k-space via Parseval's theorem, $$\rho_{ij}(\delta_i-\delta_j)=\int f_i(x-\delta_i)f_j^*(x-\delta_j)\propto\int F_i(k)F_j^*(k)e^{ik(\delta_i-\delta_j)}dk \qquad (3);$$

where $F_i$ and $F_j$ are the Fourier transforms of $f_i$ and $f_j$, respectively. Some examples of correlations between blades are shown as the solid lines in FIG. 3A.

The motion estimation and correction process can thus be carried out by finding the relative shift that maximizes the correlation in Eqn. (3). The location at which the maximum correlation occurs is the estimated relative shift, $(\delta_i-\delta_j)$, between the two blades.

Unlike previous methods for motion estimation and correction in PROPELLER MRI, the present invention establishes a system of linear equations for the relative shift between each pair of blades and solves for the entire system at one time. Thus, unlike previous methods, a reference blade is not required, nor is an iterative procedure for motion correction.

When performing motion correction, the correlation, $\rho_{ij}(\delta_i-\delta_j)$, is calculated for each pair of blades in the acquired data. For N blades, there are N (N−1)/2 unique blade pairs. A quadratic approximation of the correlation, $\rho_{ij}$, over the region near the maximum yields, $$\hat{\rho}_{ij}(\delta_i-\delta_j)=a_{ij}(\delta_i-\delta_j)^2+b_{ij}(\delta_i-\delta_j)+c_{ij} \qquad (4).$$

By way of example, the parameters for this second-order fit can be obtained using a least-squares fit to a selected number of points about the maximum value. As an example, the selected number of points can be eleven points. The fits are illustrated as the dashed lines in FIG. 3A.

The desire is to obtain the maximum correlation for a given blade pair. Once the parameters $a_{ij}$ and $b_{ij}$ are known, the peak of Eqn. (4) can be posed analytically as, $$\frac{\partial \hat{\rho}_{ij}}{\partial \delta_i} = 2a_{ij}(\delta_i - \delta_j) + b_{ij} = 0. \qquad (5)$$

It is noted that taking the derivative with respect to $\delta_j$ functionally yields the same equation as Eqn. (5). The set of equations for all blade pairs is expressed in the linear equation, $$A\Delta=-B \qquad (6);$$

where A is an $$N \times \frac{N(N-1)}{2}$$

matrix whose elements are $a_{ij}$; $\Delta$ is an N-length vector whose elements are $\delta_i$; and B is an $$\frac{N(N-1)}{2}$$

length vector whose elements are $b_{ij}$. In order to account for the peak correlation between each blade pair, each equation (i.e., each $(a_{ij},b_{ij})$ pair) is multiplied by a weighting factor that weights the contribution of that equation to the final solution by the degree of maximum correlation. An example of the weighting factor is, $$w_{ij} = e^{-0.5\left(\frac{1-max(\rho_{ij})}{\sigma}\right)^2} \quad (7)$$

Figure 3B:
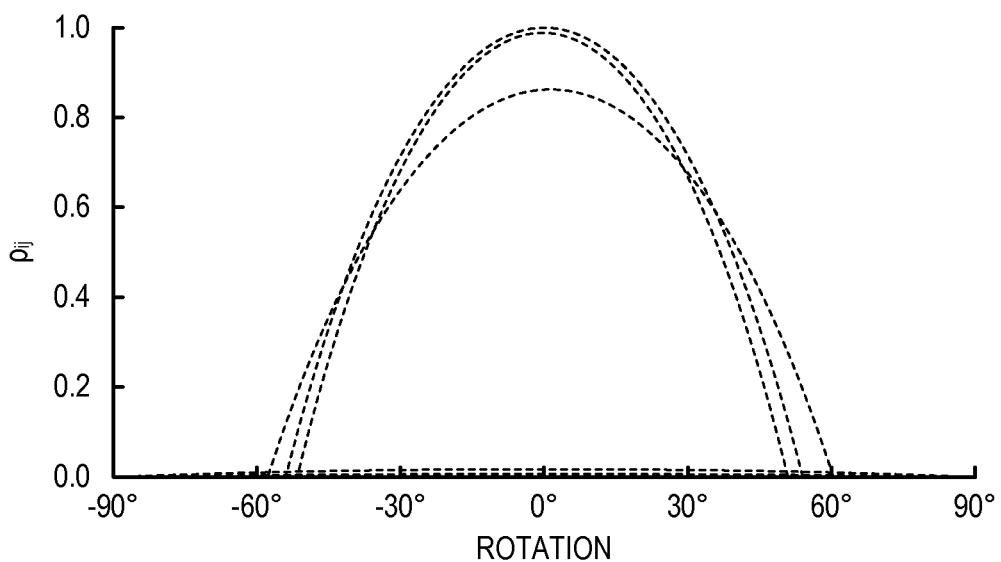
FIG. 3B is an example of the quadratic functions illustrated in FIG. 3A after being weighted to account for peak correlation between each blade pair.

An example of the quadratic functions of Eqn. (6), weighted by Eqn. (7), are shown in FIG. 3B.

Because all of the displacements are relative, without modification, there are an infinite number of solutions to Eqn. (6). The unique solution with zero average displacement can be determined, however, by adding the following equation to the system of equations:

$$\sum_i \delta_i = 0. \quad (8)$$

After the modifications of Eqns. (7) and (8) are applied to Eqn. (6), the solution set, $\Delta$, that maximizes the weighted correlation estimates is found. By way of example, the solution can be found by multiplying the B vector by the Moore-Penrose pseudoinverse of the A matrix. Because the A matrix contains the second-order coefficients of Eqn. (4) for each blade pair, this solution incorporates the curvature of the correlation function, providing some weighting of the noise sensitivity inherent in choosing the value of $\delta_i$ corresponding to the peak.

Referring again to FIG. 1, after the data have been processed to correct for motion, an image is reconstructed, as indicated at step 114. Image reconstruction generally includes combining the blades while regridding them onto a Cartesian grid. Sampling density for this regridding can be calculated using correlation-based weights, which reduces the relative weighting of blades that do not correlate well with the other blades.

Figure 4:
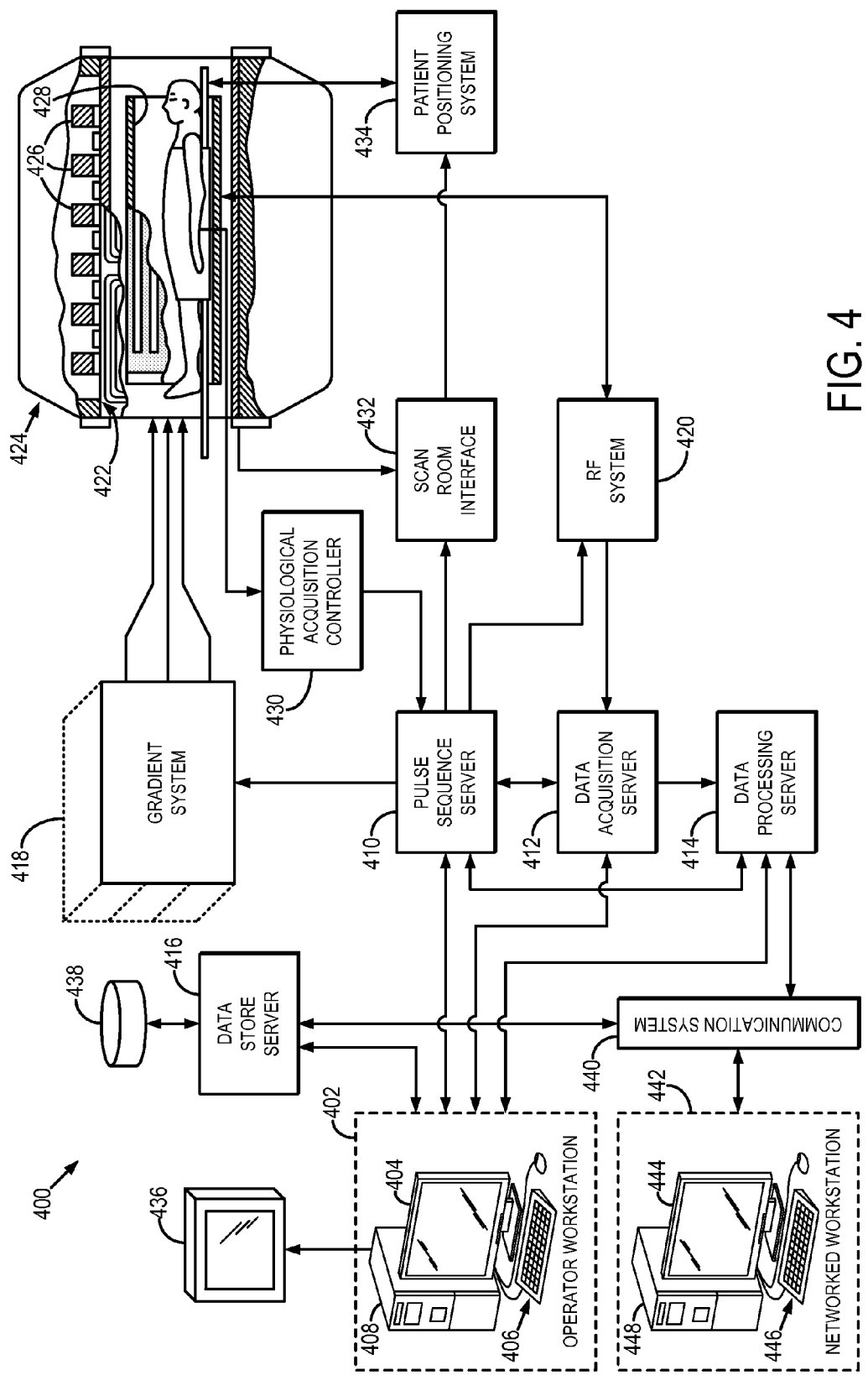
FIG. 4 is a block diagram of an example of an MRI system.

Referring particularly now to FIG. 4, an example of a magnetic resonance imaging ("MRI") system 400 is illustrated. The MRI system 400 includes an operator workstation 402, which will typically include a display 404; one or more input devices 406, such as a keyboard and mouse; and a processor 408. The processor 408 may include a commercially available programmable machine running a commercially available operating system. The operator workstation 402 provides the operator interface that enables scan prescriptions to be entered into the MRI system 400. In general, the operator workstation 402 may be coupled to four servers: a pulse sequence server 410; a data acquisition server 412; a data processing server 414; and a data store server 416. The operator workstation 402 and each server 410, 412, 414, and 416 are connected to communicate with each other. For example, the servers 410, 412, 414, and 416 may be connected via a communication system 440, which may include any suitable network connection, whether wired, wireless, or a combination of both. As an example, the communication system 440 may include both proprietary or dedicated networks, as well as open networks, such as the internet.

The pulse sequence server 410 functions in response to instructions downloaded from the operator workstation 402 to operate a gradient system 418 and a radiofrequency ("RF") system 420. Gradient waveforms necessary to perform the prescribed scan are produced and applied to the gradient system 418, which excites gradient coils in an assembly 422 to produce the magnetic field gradients $G_x$, $G_y$, and $G_z$ used for position encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil (not shown in FIG. 4), in order to perform the prescribed magnetic resonance pulse sequence. Responsive magnetic resonance signals detected by the RF coil 428, or a separate local coil (not shown in FIG. 4), are received by the RF system 420, where they are amplified, demodulated, filtered, and digitized under direction of commands produced by the pulse sequence server 410. The RF system 420 includes an RF transmitter for producing a wide variety of RF pulses used in MRI pulse sequences. The RF transmitter is responsive to the scan prescription and direction from the pulse sequence server 410 to produce RF pulses of the desired frequency, phase, and pulse amplitude waveform. The generated RF pulses may be applied to the whole-body RF coil 428 or to one or more local coils or coil arrays (not shown in FIG. 4).

The RF system 420 also includes one or more RF receiver channels. Each RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (9);$$

and the phase of the received magnetic resonance signal may also be determined according to the following relationship:

$$\varphi = \tan^{-1}\left(\frac{Q}{I}\right). \quad (10)$$

The pulse sequence server 410 also optionally receives patient data from a physiological acquisition controller 430. By way of example, the physiological acquisition controller 430 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 410 to synchronize, or "gate," the performance of the scan with the subject's heart beat or respiration.

The pulse sequence server 410 also connects to a scan room interface circuit 432 that receives signals from various sensors associated with the condition of the patient and the magnet system. It is also through the scan room interface circuit 432 that a patient positioning system 434 receives commands to move the patient to desired positions during the scan.

The digitized magnetic resonance signal samples produced by the RF system 420 are received by the data acquisition server 412. The data acquisition server 412 operates in response to instructions downloaded from the operator workstation 402 to receive the real-time magnetic resonance data and provide buffer storage, such that no data is lost by data overrun. In some scans, the data acquisition server 412 does little more than pass the acquired magnetic resonance data to the data processor server 414. However, in scans that require information derived from acquired magnetic resonance data to control the further performance of the scan, the data acquisition server 412 is programmed to produce such information and convey it to the pulse sequence server 410. For example, during prescans, magnetic resonance data is acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In all these examples, the data acquisition server 412 acquires magnetic resonance data and processes it in real-time to produce information that is used to control the scan.

The data processing server 414 receives magnetic resonance data from the data acquisition server 412 and processes it in accordance with instructions downloaded from the operator workstation 402. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 414 are conveyed back to the operator workstation 402 where they are stored. Real-time images are stored in a data base memory cache (not shown in FIG. 4), from which they may be output to operator display 412 or a display 436 that is located near the magnet assembly 424 for use by attending physicians. Batch mode images or selected real time images are stored in a host database on disc storage 438. When such images have been reconstructed and transferred to storage, the data processing server 414 notifies the data store server 416 on the operator workstation 402. The operator workstation 402 may be used by an operator to archive the images, produce films, or send the images via a network to other facilities.

The MRI system 400 may also include one or more networked workstations 442. By way of example, a networked workstation 442 may include a display 444; one or more input devices 446, such as a keyboard and mouse; and a processor 448. The networked workstation 442 may be located within the same facility as the operator workstation 402, or in a different facility, such as a different healthcare institution or clinic.

The networked workstation 442, whether within the same facility or in a different facility as the operator workstation 402, may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may exchanged between the data processing server 414 or the data store server 416 and the networked workstations 442, such that the data or images may be remotely processed by a networked workstation 442. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing a motion-corrected image using a magnetic resonance imaging (MRI) system, the steps of the method comprising: a) acquiring data with the MRI system by sampling k-space as a series of blades, each blade containing a plurality of parallel linear trajectories in k-space, wherein the blades are rotated with respect to each other and include a total of N blades; b) selecting a pair of blades including a first blade and a second blade from the total of N blades; c) forming an equation relating a relative shift value that maximizes a correlation value between the first blade and the second blade; d) repeating steps b)-cd) for a majority of N(N−1)/2 pairs of blades in the acquired data; e) solving the equations formed from the repetition of step c) to create motion-corrected blades for the N(N−1)/2 pairs of blades in the acquired data; and f) reconstructing an image from the motion-corrected blades.

2. The method as recited in claim 1 in which step c) includes calculating a relative shift value along at least one of a rotation direction and a translation direction.

3. The method as recited in claim 1 in which step c) includes calculating the correlation value as a function of relative displacement between the first and second blades.

4. The method as recited in claim 1 in which step c) includes calculating a correlation value between the first and second blade for a plurality of different relative shift values and identifying the relative shift value associated with the maximum correlation value.

5. The method as recited in claim 4 in which the relative shift value associated with the maximum correlation value is identified by fitting the calculated correlation values to a function.

6. The method as recited in claim 5 in which the function is a quadratic function of relative shift values.

7. The method as recited in claim 5 in which the relative shift value associated with the maximum correlation value is identified by determining the relative shift value that zeroes a first derivative of the function.

8. The method as recited in claim 5 in which the relative shift value associated with the maximum correlation value is identified by solving a system of equations having a form, $$A\Delta = -B;$$

wherein A is a matrix of fitting parameters, $\Delta$ is a vector of relative shift values, and B is a vector of fitting parameters.

9. The method as recited in claim 8 in which the system of equations further includes an equation that seeks a solution with zero average displacement.

10. The method as recited in claim 8 in which the system of equations includes a weighting factor that weights peak correlations by a degree of maximum correlation.

11. The method as recited in claim 10 in which the weighting factor has a form, $$w_{ij} = e^{-0.5\left(\frac{1-max(\rho_{ij})}{\sigma}\right)^2};$$

wherein $w_{ij}$ is the weighting factor, $\rho_{ij}$ is a correlation value, and $\sigma$ is a standard deviation value.

12. The method as recited in claim 1 in which step c) includes reconstructing a first image from the first blade; reconstructing a second image from the second blade; and calculating a relative shift value that maximizes a correlation value between the first image and the second image.

13. The method as recited in claim 12 in which step d) includes applying the calculated relative shift value to at least one of the first image and the second image.

14. The method as recited in claim 1 in which step f) includes combining the motion-corrected blades.

15. The method as recited in claim 1 in which step d) includes applying the relative shift value to both the first and second blade to produce a pair of motion-corrected blades.

16. The method as recited in claim 1 in which each blade includes a plurality of linear trajectories.

17. The method as recited in claim 16 in which the plurality of linear trajectories comprises a plurality of parallel linear trajectories.

18. The method as recited in claim 17 in which the plurality of parallel linear trajectories are uniformly spaced apart.

19. A method for producing a motion-corrected image using a magnetic resonance imaging (MRI) system, the steps of the method comprising:
 a) acquiring data with the MRI system by sampling k-space as a series of blades that are rotated with respect to each other, each blade including at least one linear trajectory;
 b) selecting a pair of blades including a first blade and a second blade from the acquired data;
 c) calculating a relative shift value that maximizes a correlation value between the first blade and the second blade;
 d) applying the relative shift value to at least one of the selected blades to produce at least one motion-corrected blade;
 e) repeating steps b)-d) for each pair of blades in the acquired data;
 f) reconstructing an image from the motion-corrected blades;
 in which step c) includes calculating a correlation value between the first and second blade for a plurality of different relative shift values and identifying the relative shift value associated with the maximum correlation value;
 in which the relative shift value associated with the maximum correlation value is identified by fitting the calculated correlation values to a function; and
 in which the relative shift value associated with the maximum correlation value is identified by solving a system of equations having a form, $$A\Delta = -B;$$

wherein A is a matrix of fitting parameters, $\Delta$ is a vector of relative shift values, and B is a vector of fitting parameters.

20. A method for producing a motion-corrected image using a magnetic resonance imaging (MRI) system, the steps of the method comprising:
 a) acquiring data with the MRI system by sampling k-space as a series of blades, each blade containing a plurality of parallel linear trajectories in k-space, wherein the blades are rotated with respect to each other and include a total of N blades;
 b) selecting a pair of blades including a first blade and a second blade from the total of N blades;
 c) forming an equation relating a relative shift value that maximizes a correlation value between the first blade and the second blade;
 d) repeating steps b) and c) for the N blades to form a system of linear equations relating relative shift between $N(N-1)/2$ pair of blades in the N blades;
 e) solving the system of linear equations at one time to determine a relative shift value to each of the $N(N-1)/2$ pair of blades in the N blades that corrects motion in the acquired data; and
 f) reconstructing a motion-corrected image using the acquired data and the relative shift value to each of the $N(N-1)/2$ pair of blades.

* * * * *

UNITED STATES PATENT AND TRADEMARK OFFICE
CERTIFICATE OF CORRECTION

PATENT NO. : 9,933,505 B2  
APPLICATION NO. : 14/781659  
DATED : April 3, 2018  
INVENTOR(S) : James Grant Pipe Page 1 of 1

It is certified that error appears in the above-identified patent and that said Letters Patent is hereby corrected as shown below:

In the Claims

Column 8, Claim 1, Line 12, "b)-cd)" should be --b)-c)--.

Signed and Sealed this
Fifteenth Day of May, 2018

Andrei Iancu
*Director of the United States Patent and Trademark Office*